(12) United States Patent
Zhao et al.

(10) Patent No.: US 11,324,104 B2
(45) Date of Patent: May 3, 2022

(54) MAGNETIC PROBE DEVICE

(71) Applicant: Dalian University of Technology, Dalian (CN)

(72) Inventors: Kai Zhao, Dalian (CN); Yongxin Liu, Dalian (CN); Younian Wang, Dalian (CN)

(73) Assignee: Dalian University of Technology, Dalian (CN)

( * ) Notice: Subject to any disclaimer, the term of this patent is extended or adjusted under 35 U.S.C. 154(b) by 398 days.

(21) Appl. No.: 16/516,484

(22) Filed: Jul. 19, 2019

(65) Prior Publication Data
US 2020/0053861 A1 Feb. 13, 2020

(30) Foreign Application Priority Data
Aug. 9, 2018 (CN) .......................... 201810901359.4

(51) Int. Cl.
*H05H 1/00* (2006.01)
*H01F 27/29* (2006.01)
*H01B 11/18* (2006.01)
*H01F 27/36* (2006.01)
*G01R 33/02* (2006.01)
*G01R 13/00* (2006.01)

(52) U.S. Cl.
CPC .......... *H05H 1/0087* (2013.01); *G01R 13/00* (2013.01); *G01R 33/02* (2013.01); *H01B 11/1895* (2013.01); *H01F 27/29* (2013.01); *H01F 27/36* (2013.01)

(58) Field of Classification Search
CPC .......... H02K 1/276; H02K 1/28; H02K 15/03
See application file for complete search history.

(56) References Cited

U.S. PATENT DOCUMENTS

| | | | | |
|---|---|---|---|---|
| 4,049,535 A | * | 9/1977 | Winslow, Jr. .......... | C10G 33/02 204/663 |
| 4,425,541 A | * | 1/1984 | Burkum ................ | G01R 31/50 324/548 |
| 5,243,289 A | * | 9/1993 | Blum ................ | G01R 33/3635 324/322 |

(Continued)

*Primary Examiner* — Christopher P McAndrew
*Assistant Examiner* — Zannatul Ferdous
(74) *Attorney, Agent, or Firm* — Harness, Dickey & Pierce, P.L.C.

(57) ABSTRACT

The present invention discloses a magnetic probe device. The magnetic probe device includes a magnetic probe body and a signal processing circuit, and an output end of the magnetic probe body is connected with an input end of the signal processing circuit; the signal processing circuit includes a first capacitor, a second capacitor, a Faraday shield and a step-up transformer, and the Faraday shield is fixedly arranged between a primary winding and a secondary winding of the step-up transformer; a center tap is arranged at the primary winding of the step-up transformer, and the center tap is grounded; and a first end of the primary winding is in series connection with the first capacitor, and a second end of the primary winding is in series connection with the second capacitor. The magnetic probe device provided by the present invention can improve the signal-to-noise ratio of a magnetic probe and the measurement accuracy of the magnetic field in plasma.

7 Claims, 2 Drawing Sheets

(56) References Cited

U.S. PATENT DOCUMENTS

| | | | | |
|---|---|---|---|---|
| 5,905,468 A | * | 5/1999 | Ikawa | H01Q 1/1278 |
| | | | | 343/713 |
| 2002/0011115 A1 | * | 1/2002 | Frick | G01D 11/245 |
| | | | | 73/718 |
| 2007/0257662 A1 | * | 11/2007 | Mende | G01R 1/06788 |
| | | | | 324/117 R |
| 2017/0067940 A1 | * | 3/2017 | Chen | G01R 15/183 |

* cited by examiner

MAGNETIC PROBE DEVICE

CROSS-REFERENCE TO RELATED APPLICATIONS

This application claims priority to Chinese application number 201810901359.4, filed Aug. 9, 2018, with a title of MAGNETIC PROBE DEVICE. The above-mentioned patent application is incorporated herein by reference in its entirety.

TECHNICAL FIELD

The present invention relates to the field of magnetic diagnostics, and in particular to a magnetic probe device.

BACKGROUND

Capacitively coupled plasma (CCP) sources and inductively coupled plasma (ICP) sources have been widely used in the fields of chip manufacturing, solar cell manufacturing, flat-panel display manufacturing, micro electro mechanical processing and the like. Plasma material processing has become a core technology in the semiconductor industry. People carry out in-situ measurements of important parameters on the plasma source by utilizing various technological diagnostics in order to optimize technological parameters, save costs and improve the productivity.

Magnetic probe, as an important tool for measuring the spatial electromagnetic field in plasmas, has been applied to the fields of nuclear fusion devices, magnetic mirror machines, radio frequency (RF) plasma sources, exploding plasmas and the like. A typical magnetic probe has a very simple structure and is generally manufactured by a plurality of turns of induction coils, and its basic principle is to utilize Faraday Law of Electromagnetic Induction. When the magnetic probe is placed in an alternating magnetic field, an induced electromotive force $V_p$ of two ends of the coil is in direct proportion to a magnetic field intensity B, namely, $V_p(t)=-j\omega naBe^{j\omega t}$, where $\omega$ is a magnetic field angular frequency, n is the number of turns of the probe coil, and a is the cross sectional area of the coil. In particular, magnetic diagnostics in the ICP source is quite important since it is the time-varying magnetic field that induces the electric field maintaining the discharge. Magnetic field measurements allow visualization of the spatial distribution of RF current density, electric field as well as power deposition in the reactor, providing insights into important physics. However, in a CCP source, the discharge is primarily sustained by an RF electric field, and the spatial magnetic field is relatively weaker, so accurate measurements of the magnetic field are more challenging. Furthermore, the capacitive coupling between the probe coil and the oscillating plasma potential may generate serious interference signals, thereby causing bad measurement accuracy of the magnetic probe.

SUMMARY

An objective of the present invention is to provide a magnetic probe device in order to improve the anti-interference performance of the magnetic probe device and the measurement accuracy of the plasma.

To achieve the above purpose, the present invention provides the following technical solution.

A magnetic probe device includes a magnetic probe body and a signal processing circuit, and an output end of the magnetic probe body is connected with an input end of the signal processing circuit; the signal processing circuit includes a first capacitor, a second capacitor, a Faraday shield and a step-up transformer, and the Faraday shield is fixedly arranged between a primary winding and a secondary winding of the step-up transformer; a center tap is arranged at the primary winding of the step-up transformer, and the center tap is grounded; and a first end of the primary winding is in series connection with the first capacitor, and a second end of the primary winding is in series connection with the second capacitor.

Optionally, the magnetic probe device further includes an oscilloscope, an output end of the signal processing circuit is connected with the oscilloscope, and the oscilloscope is used for displaying an output voltage of the signal processing circuit.

Optionally, the magnetic probe body specifically includes a probe head, a first coaxial cable, a second coaxial cable and a quartz tube; the first coaxial cable and the second coaxial cable are arranged in parallel, the first coaxial cable and the second coaxial cable are exteriorly and integrally coated with an aluminum foil, and the first coaxial cable and the second coaxial cable, which are coated with the aluminum foil, are inserted to and fixed in the interior of the quartz tube; the probe head is formed by a two-turn coil; a first end of the probe head is connected with a first end of the first coaxial cable, and a second end of the probe head is connected with a first end of the second coaxial cable; a second end of the first coaxial cable is connected with the first end of the primary winding of the step-up transformer; and a second end of the second coaxial cable is connected with the second end of the primary winding of the step-up transformer.

Optionally, the diameter of the coil is 10 mm, and the material of the coil is an enameled wire or a tungsten wire.

Optionally, the characteristic impedance of the first coaxial cable is 50 ohms, and the characteristic impedance of the second coaxial cable is 50 ohms.

Optionally, the magnetic probe body further includes a first subminiature version A (SMA) RF connector and a second SMA RF connector; and the second end of the first coaxial cable is connected with the first end of the primary winding through the first SMA RF connector, and the second end of the second coaxial cable is connected with the second end of the primary winding through the second SMA RF connector.

Optionally, both the first capacitor and the second capacitor are variable capacitors.

Optionally, the capacitance value of the first capacitor is 155 pF, and the capacitance value of the second capacitor is 155 pF.

According to specific embodiments provided in the present invention, the present invention discloses the following technical effects: by utilizing a signal processing circuit, functions of improving a magnetic induction signal and reducing a capacitive interference signal can be simultaneously achieved, a signal-to-noise ratio of the magnetic probe is remarkably improved, and the measurement accuracy of the magnetic field in the plasma is improved. Moreover, the circuit provided by the present invention is simple and is applicable to most of the magnetic probes. In use, an optimal operating point of the circuit can be achieved by regulating the capacitance parameters, and the magnetic probe is convenient to operate.

DRAWINGS

To describe the technical solutions in the embodiments of the present invention or in the prior art more clearly, the following briefly describes the accompanying drawings required for describing the embodiments. Apparently, the accompanying drawings in the following description show some embodiments of the present invention, and a person of ordinary skill in the art may still derive other drawings from these accompanying drawings without creative efforts.

DETAILED DESCRIPTION

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

A magnetic probe is an important tool for plasma diagnostics, and a signal-to-noise ratio of the magnetic probe is a key index for evaluating its reliability. Especially in a CCP source, it is very difficult to measure a magnetic field due to the presence of a weak magnetic field and a strong electric field, and how to improve the signal-to-noise ratio becomes an essential technology of accurate magnetic diagnostics. The present invention provides a magnetic probe device in order to improve the signal-to-noise ratio of a magnetic probe. By regulating capacitance parameters in a signal processing circuit, the inductive signal from the magnetic probe is remarkably improved, meanwhile, the capacitive interference signal is suppressed, and a higher signal-to-noise ratio is achieved. The present invention has the advantages of simple structure, strong anti-interference performance and applicability to magnetic diagnostics of a CCP source device.

To make the foregoing objective, features, and advantages of the present invention clearer and more comprehensible, the present invention is further described in detail below with reference to the accompanying drawings and specific embodiments.

Figure 1:
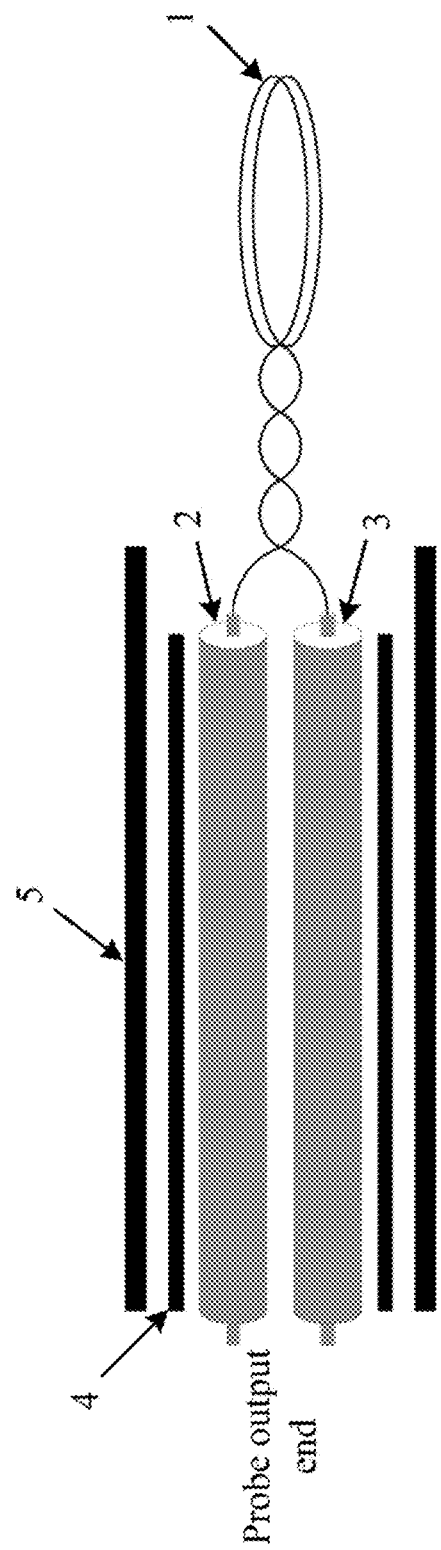
FIG. 1 is a schematic structural diagram of a magnetic probe body in a magnetic probe device provided by the present invention.

A magnetic probe device provided by the present invention includes two parts, namely a magnetic probe body and a signal processing circuit, and an output end of the magnetic probe body is connected with an input end of the signal processing circuit. FIG. 1 is a schematic structural diagram of a magnetic probe body in a magnetic probe device provided by the present invention. As shown in FIG. 1, the magnetic probe body includes a probe head 1, a first coaxial cable 2, a second coaxial cable 3, an aluminum foil 4 and a quartz tube 5. The probe head 1 is made from an enameled wire with the diameter of 0.5 mm (or a tungsten wire under a high temperature environment) and includes a two-turn coil, and the diameter of the coil is 10 mm. Two ends of the probe head 1 (namely two ends of the coil) are respectively connected with two coaxial cables, a first end of the probe head 1 (namely a first end of the coil) is connected with a first end of a first coaxial cable 2, and a second end of the probe head 1 is connected with a first end of a second coaxial cable 3. The first coaxial cable 2 and the second coaxial cable 3 are arranged in parallel and are clung together, the first coaxial cable 2 and the second coaxial cable 3 are exteriorly and integrally coated with the aluminum foil 4, that is, the aluminum foil 4 covers both of the coaxial cables inside, and the first coaxial cable 2 and the second coaxial cable 3, which are coated with the aluminum foil 4, are inserted to and fixed in the interior of the quartz tube 5. The characteristic impedance of the first coaxial cable 2 is 50 ohms, the characteristic impedance of the second coaxial cable 3 is 50 ohms, and the diameter of the quartz tube 5 is 6 mm.

Figure 2:
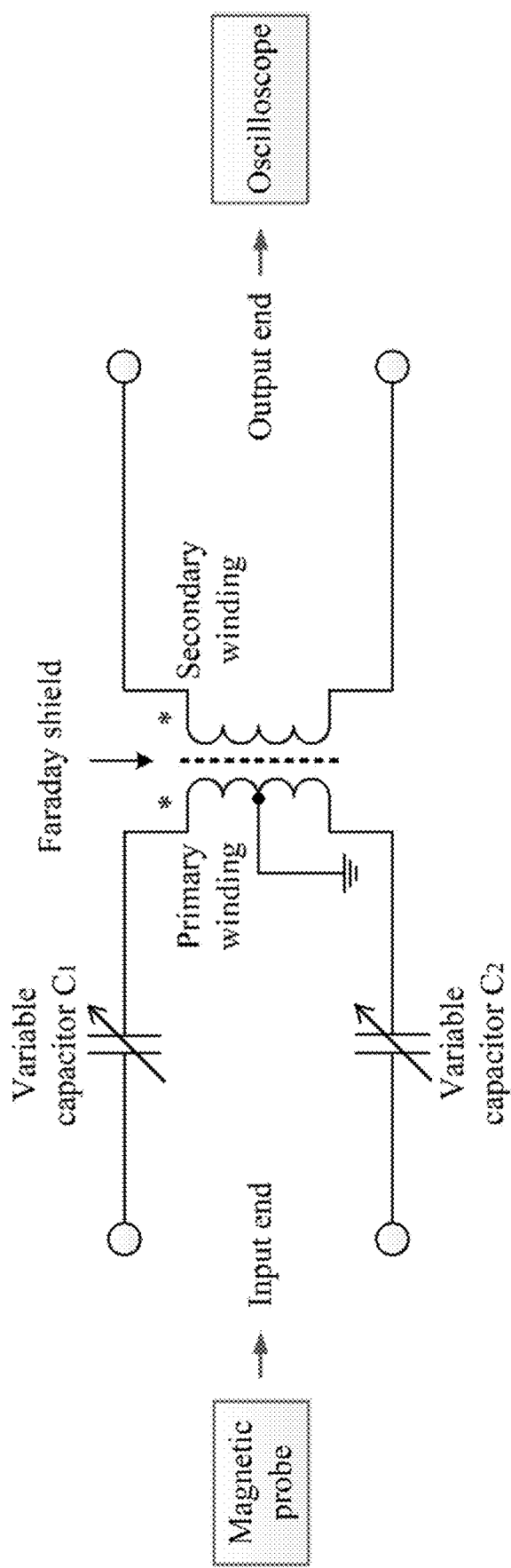
FIG. 2 is a schematic structural diagram of a signal processing circuit in the magnetic probe device provided by the present invention.

In order to improve the signal-to-noise ratio of the magnetic probe, a probe signal processing circuit shown in FIG. 2 is utilized. FIG. 2 is a schematic structural diagram of a signal processing circuit in the magnetic probe device provided by the present invention. The signal processing circuit is mainly formed by coupling a series resonance circuit and a step-up transformer. The signal processing circuit includes a first capacitor $C_1$, a second capacitor $C_2$, a Faraday shield and a step-up transformer. The Faraday shield is fixedly arranged between a primary winding and a secondary winding of the step-up transformer and is used for suppressing capacitive coupling between the primary winding and the secondary winding. A center tap is arranged at the primary winding of the step-up transformer, and the center tap is grounded. The first capacitor and the second capacitor are in series connection with the primary winding of the step-up transformer in order to form a series resonance circuit, specifically, a first end of the primary winding is in series connection with the first capacitor $C_1$, a second end of the primary winding is in series connection with the second capacitor $C_2$, and both the first capacitor $C_1$ and the second capacitor $C_2$ are variable capacitors.

The second end of the first coaxial cable in the magnetic probe body is connected with the first end of the primary winding of the step-up transformer through an SMA RF connector; and the second end of the second coaxial cable is connected with the second end of the primary winding of the step-up transformer through another SMA RF connector. An output end of the signal processing circuit is connected with an oscilloscope. At this time, the probe head of the magnetic probe body is placed in an alternating magnetic field, an induced voltage generated in the coil of the probe head and then processed through the signal processing circuit is displayed on the oscilloscope, so that an amplitude of the output voltage can be read and obtained. Finally, the intensity of the magnetic field can be determined through a calibration relation of the output voltage and the magnetic field.

In combination with the signal processing circuit according to the present invention, the influence on the sensitivity of the magnetic probe device of the capacitances of the first capacitor and the second capacitor is discussed as follows.

Firstly, the function of amplifying the inductive signal by the signal processing circuit is provided. In the present embodiment, the frequency of a utilized test magnetic field is 13.56 MHz, and the $C_1$ in the circuit is fixed at 170 pF. The output voltage of the magnetic probe can be remarkably changed by regulating the $C_2$. In an experimental parameter range, an output voltage $U_0$ of the magnetic probe is firstly increased and then reduced with the $C_2$, and when the $C_2$ is equal to 150 pF, the output voltage reaches a maximum value. At this time, the output voltage $U_0$ of the magnetic probe is about 43 mV, which is more than one order of magnitude greater than the internal induced voltage (about 4 mV) of the coil of the magnetic probe. Therefore, output of the induction signal of the magnetic probe can be remarkably improved by regulating the $C_2$, resulting in effective improvement of its magnetic sensitivity.

The function of suppressing the capacitive interference signal by the signal processing circuit is provided below. During practical plasma discharge, besides the alternating magnetic field generates an induction signal in the coil, capacitive coupling between the plasma potential and the magnetic probe may cause a serious capacitive interference signal. Especially in a CCP discharge, generally the intensity of the capacitive interference signal is further greater than that of the inductive signal. By taking the $C_1$ with the constant of 170 pF for example, the capacitive output voltage $U_0$ is sequentially increased, reduced and further increased with the $C_2$. In a most parameter range, the capacitive output voltage $U_0$ is relatively larger, and even greater than the intensity of the above induction signal. However, when the $C_2$ is equal to 170 pF, the $U_0$ reaches a minimum value (is less than 4 mV). Therefore, by regulating the $C_2$, the capacitive interference signal of the magnetic probe can be remarkably reduced, and its anti-interference performance is effectively improved. Furthermore, the experiment result shows that an optimal operating point of the probe circuit can be determined by fine adjusting the $C_1$, that is, a maximum inductive signal and a minimum capacitive signal can be achieved at the same time under the same $C_2$ parameter.

The optimal operating point finally obtained by the experiment is: $C_1=C_2=155$ pF.

Each embodiment of the present specification is described in a progressive manner, each embodiment focuses on the difference from other embodiments, and the same and similar parts between the embodiments may refer to each other.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the invention.

What is claimed is:

1. A magnetic probe device, comprising:
   a magnetic probe body; and
   a signal processing circuit;
   an output end of the magnetic probe body is connected with an input end of the signal processing circuit;
   the signal processing circuit comprises a first capacitor, a second capacitor, a Faraday shield and a step-up transformer;
   the Faraday shield is fixedly arranged between a primary winding and a secondary winding of the step-up transformer;
   a center tap is arranged at the primary winding of the step-up transformer, and the center tap is grounded; and
   a first end of the primary winding is in series connection with the first capacitor, and a second end of the primary winding is in series connection with the second capacitor;
   wherein, the magnetic probe body comprises a probe head, a first coaxial cable, a second coaxial cable and a quartz tube;
   the first coaxial cable and the second coaxial cable are arranged in parallel, the first coaxial cable and the second coaxial cable are exteriorly and integrally coated with an aluminum foil, and the first coaxial cable and the second coaxial cable, which are coated with the aluminum foil, are inserted to and fixed in an interior of the quartz tube;
   the probe head is formed by a two-turn coil;
   a first end of the probe head is connected with a first end of the first coaxial cable, and a second end of the probe head is connected with a first end of the second coaxial cable; a second end of the first coaxial cable is connected with the first end of the primary winding of the step-up transformer; and,
   a second end of the second coaxial cable is connected with the second end of the primary winding of the step-up transformer.

2. The magnetic probe device according to claim 1, wherein the magnetic probe device further comprises an oscilloscope, an output end of the signal processing circuit is connected with the oscilloscope, and the oscilloscope is used for displaying an output voltage of the signal processing circuit.

3. The magnetic probe device according to claim 1, wherein a diameter of the coil is 10 mm, and a material of the coil is an enameled wire or a tungsten wire.

4. The magnetic probe device according to claim 1, wherein the characteristic impedance of the first coaxial cable is 50 ohms, and the characteristic impedance of the second coaxial cable is 50 ohms.

5. The magnetic probe device according to claim 1, wherein a magnetic probe body further comprises a first subminiature version (SMA) radio frequency (RF) connector and a second SMA RF connector; and the second end of the first coaxial cable is connected with the first end of the primary winding through the first SMA RF connector, and the second end of the second coaxial cable is connected with the second end of the primary winding through the second SMA RF connector.

6. The magnetic probe device according to claim 1, wherein the first capacitor and the second capacitor are variable capacitors.

7. The magnetic probe device according to claim 1, wherein a capacitance value of the first capacitor is 155 pF, and the capacitance value of the second capacitor is 155 pF.

* * * * *